(12) United States Patent
Lee et al.

(10) Patent No.: US 6,358,781 B1
(45) Date of Patent: Mar. 19, 2002

(54) UNIFORM CURRENT DISTRIBUTION SCR DEVICE FOR HIGH VOLTAGE ESD PROTECTION

(75) Inventors: Jian-Hsing Lee; Kuo-Chio Liu, both of Hsin-Chu; Bing-Lung Liao, Taipei; Jiaw-Ren Shih, Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/607,043

(22) Filed: Jun. 30, 2000

(51) Int. Cl.[7] .............................................. H01L 21/332
(52) U.S. Cl. ...................................... 438/133; 257/107
(58) Field of Search ................................. 438/133, 134, 438/135, 323, 324; 257/107, 173

(56) References Cited

U.S. PATENT DOCUMENTS

| | | | | |
|---|---|---|---|---|
| 5,430,595 A | * | 7/1995 | Wagner et al. | 361/56 |
| 5,455,436 A | | 10/1995 | Cheng | 257/356 |
| 5,572,394 A | | 11/1996 | Ker et al. | 361/56 |
| 5,576,557 A | | 11/1996 | Ker et al. | 257/173 |
| 5,623,156 A | * | 4/1997 | Watt | 257/355 |
| 5,637,900 A | * | 6/1997 | Ker et al. | 257/355 |
| 5,745,323 A | | 4/1998 | English et al. | 361/56 |
| 5,751,042 A | * | 5/1998 | Yu | 257/360 |
| 5,754,380 A | | 5/1998 | Ker et al. | 361/56 |
| 5,754,381 A | | 5/1998 | Ker | 361/56 |
| 5,825,600 A | * | 10/1998 | Watt | 361/56 |
| 5,872,379 A | | 2/1999 | Lee | 257/355 |
| 5,905,288 A | | 5/1999 | Ker | 257/355 |
| 5,959,820 A | | 9/1999 | Ker et al. | 361/111 |

OTHER PUBLICATIONS

"Lateral SCR Devices with Low–Voltage High–Current Triggering Characteristics for Output ESD Protection in Submicron CMOS Technology", Ker, IEEE Transactions On Electron Devices, vol. 45, No. 4, Apr. 1999, pp. 849–860.
"Grounded–Gate NMOS Transistor Behavior Under CDM ESD Stress Conditions", Verhaege et al., IEEE Transactions On Electron Devices, vol. 44, No. 11, Nov. 1997, pp. 1972–1980.
"Design Methodology and Optimization of Gate–Driven NMOS ESD Protection Circuits in Submicron CMOS Processes", Chen et al., IEEE Trans. On Electron Devices, vol. 45, No. 12, Dec. 1998, pp. 2448–2456.
"The State of the Art of Electrostatic Discharge Protection: Physics, Technology, Circuits, Design, Simulation, and Scaling", Voldman, IEEE Journal of Solid–State Circuits, vol. 34, No. 9, Sep. 1999, pp. 1272–1282.
"The Mirrored Lateral SCR (MILSCR) as an ESD Protection Structure: Design and Optimization Using 2–D Devices Simulation", Delage et al., IEEE Journal of Solid–State Circuits, vol. 34, No. 9, Sep. 1999, pp. 1283–1289.

* cited by examiner

Primary Examiner—David Nelms
Assistant Examiner—Quoc Hoang
(74) Attorney, Agent, or Firm—George O. Saile; Stephen B. Ackerman

(57) ABSTRACT

NMOS transistors for a high voltage process are protected from electrostatic discharge (ESD) by parasitic SCRs, where the two NMOS transistors and the two SCRs are designed to be in a completely symmetrical arrangement so that the currents in the components of the SCRs are completely uniform. This symmetry is achieved by adding a p+ diffusion to the source of one of the NMOS transistors. The added p+ diffusion guarantees that the resistance seen by both SCRs is identical. This insures even current distribution between both SCRs and thereby improves the high voltage characteristics of the ESD device.

5 Claims, 5 Drawing Sheets

UNIFORM CURRENT DISTRIBUTION SCR DEVICE FOR HIGH VOLTAGE ESD PROTECTION

RELATED PATENT APPLICATION

TSMC98-527, A COMBINED NMOS AND SCR ESD PROTECTION DEVICE title filing date: May 3, 1999 now U.S. Pat. No. 6,066,879 Ser. No. 09/304,304, assigned to a common assignee.

BACKGROUND OF THE INVENTION

1. Field of the Invention

The invention relates to the protection of integrated circuits from electrostatic discharge (ESD), and more particularly to the protection of high voltage NMOS transistors by parasitic silicon controlled rectifiers (SCR) which carry equal currents.

2. Description of the Related Art

The protection of integrated circuits from electrostatic discharge (ESD) is a subject which has received a lot of attention from circuit designers because of the serious damage that ESD can wreak as device dimensions are reduced. Workers in the field and inventors have proposed many solutions, many trying to solve the problem of protecting sub-micron devices while still allowing them to function unencumbered and without undue, or zero, increase of silicon real estate. The main thrust of ESD protection for MOS devices is focused on the use of parasitic npn and pnp bipolar transistors which together form a lateral silicon controlled rectifier (SCR). Unwanted as this SCR normally is, it can safely discharge dangerous ESD voltages as long as its trigger voltage is low enough to protect those MOS devices of which it is a part.

The following publications discuss lateral SCR structures for ESD protection circuits:

"Lateral SCR Devices with Low-Voltage High-Current Triggering Characteristics for Output ESD Protection in Submicron CMOS Technology," Ker, IEEE Transactions On Electron Devices, Vol.45, No.4, April 1999, pp.849–860.

"Grounded-Gate nMos Transistor Behavior Under CDM ESD Stress Conditions," Verhaege et al., IEEE Transactions On Electron Devices, Vol.44, No.11, November 1997, pp. 1972–1980.

"Design Methodology and Optimization of Gate-Driven NMOS ESD Protection Circuits in Submicron CMOS Processes," Chen et al., IEEE Transactions On Electron Devices, Vol.45, No.12, December 1998, pp. 2448–2456.

"The State of the Art of Electrostatic Discharge Protection: Physics, Technology, Circuits, Design, Simulation, and Scaling," Voldman, IEEE Journal of Solid-State Circuits, Vol.34, No.9, September 1999, pp.1272–1282.

"The Mirrored Lateral SCR (MILSCR) as an ESD Protection Structure: Design and Optimization Using 2-D Device Simulation," Delage et al., IEEE Journal of Solid-State Circuits, Vol.34, No.9, September 1999, pp.1283–1289.

FIG. 1 is a cross-sectional schematic of a high voltage protection device layout of the prior art and FIG. 2 is the equivalent circuit. FIG. 1 shows a semiconductor wafer 100 with a p-substrate 102 having two n-wells 104, and 105, where n-wells 104 and 105 are NMOS drains. Implanted in n-well 104 are n+ diffusions 106, 108, and p+ diffusion 110 (all connected together via connection 122). Implanted into p-substrate 102 are p+ diffusion 112 and n+ diffusion 114 to one side of n-well 106, and n+ diffusion 116 to the other side of n-well 104. Diffusions 112, 114, and 116 are all connected to a reference potential 124 (typically ground). NMOS transistor T1 is formed by n-well 104, n+ diffusion 114 (source), and gate 118. NMOS transistor T2 is formed by n-well 104, n+ diffusion 116 (source), and gate 120. SCR1 consists of parasitic bipolar pnp transistor Q1 and parasitic bipolar npn transistor Q2 which are formed by p-substrate 102, n-well 104 and diffusions 110, and 114. SCR2 consists of parasitic bipolar pnp transistor Q1 and parasitic bipolar npn transistor Q3 which are formed by p-substrate 102, n-well 104 and diffusions 108, and 116. Resistors R1, R3' and R3" are equivalent resistors for the intrinsic resistance of the p-substrate 102 material. Resistors R2, and R4 are equivalent resistors for the intrinsic resistance of the n-well 104 material. Another set of NMOS transistors are arranged in a mirror image around n+ diffusion 116.

FIG. 2, the equivalent circuit of FIG. 1, shows typical parasitic silicon controlled rectifiers SCR1 and SCR2, which are comprised of Q1, Q2, R1 and R2, and Q1, Q2, R3' and R4, respectively. Note that in the figures like parts are identified by like numerals. Connected in parallel between connection 122 and reference potential 124 are shown the NMOS transistors T1 and to T2 which are protected by the action of the SCRs. Note that SCR1 sees a different resistance (R1) than SCR2 (R1+R3', where R3' is between Nodes A and B). Therefore SCR2 turns on easier and has to dissipate more current than SCR1. The non-uniform current distribution is very undesirable, because it limits the maximum voltage that the ESD protection device can withstand. The number of NMOS transistors is not limited to the two shown but depends on the current capacity desired and may be more than two as indicated in FIG. 1.

Other related art is described in the following U.S. Patents which propose low voltage lateral SCRs (LVTSCR), modified lateral SCRs (MLSCR), PMOS-trigger lateral SCRs (PTLSCR), NMOS-trigger lateral SCRs (NTLSCR), and modified PTLSCRs and NTLSCRs to control electrostatic discharge:

U.S. Pat. No. 5,959,820 (Ker et al.) describes a cascode low-voltage triggered SCR and ESD protection circuit.

U.S. Pat. No. 5,905,288 (Ker) describes an output ESD protection circuit with high-current-triggered lateral SCR.

U.S. Pat. No. 5,872,379 (Lee) describes a low voltage turn-on SCR for ESD protection.

U.S. Pat. No. 5,764,381 (Ker) provides a modified PTLSCR and NTLSCR, and bypass diodes for protection of the supply voltage and output pad of an output buffer. The trigger voltage is the low snap-back trigger voltage of a short-channel PMOS (NMOS) device.

U.S. Pat. No. 5,754,380 (Ker et al.) is similar to U.S. Pat. No. 5,754,381 above but without bypass diodes. The invention requires a smaller layout area than conventional CMOS output buffers with ESD protection.

U.S. Pat. No. 5,745,323 (English et al.) shows several embodiments for protecting semiconductor switching devices by providing a PMOS transistor which turns on when an electrostatic discharge occurs at the output of the circuit.

U.S. Pat. No. 5,576,557 (Ker et al.) provides ESD protection for sub-micron CMOS devices supplying discharge paths at $V_{dd}$ and $V_{ss}$ using two LVTSCRs. In addition a PMOS device is used in conjunction with one LVTSCR and an NMOS device with the other LVTSCR. Inclusion of the PMOS and NMOS devices allows lowering of the trigger voltage to 11–13 Volt.

U.S. Pat. No. 5,572,394 (Ker et al.) describes a CMOS on-chip four-LVTSCR ESD protection scheme for use in Deep submicron CMOS integrated circuits.

U.S. Pat. No. 5,455,436 (Cheng) describes an SCR ESD protection circuit with a non-LDD NMOS structure with a lower avalanche breakdown level than the LDD NMOS device of an output buffer.

It should be noted that none of the above-cited examples of the related art provide a symmetrical layout of components of the ESD device with a resultant uniform distribution of currents in the parasitic SCRs and thus achieving a combination of high Human Body Model (HBM) ESD Passing Voltage equal to the machine limit of 8 kVolt and a Machine Model voltage of 800V/850Volt.

SUMMARY OF THE INVENTION

It is an object of the present invention to provide an ESD device for protecting NMOS high power transistors where the SCR protection device and the NMOS transistors are integrated.

Another object of the present invention is to provide uniform current distribution in the parasitic SCRs associated with the NMOS transistors to provide increased ESD protection limits for the NMOS circuits.

A further object of the present invention is to provide HBM ESD Passing Voltage which equals the machine limit of 8,000 Volt.

A yet further object of the present invention is to provide Machine Model ESD Voltage with a pass/fail range of 800/850 Volt.

These objects have been achieved by designing the ESD device with its two NMOS transistors and its attendant parasitic SCRs in a completely symmetrical arrangement so that the currents are completely uniform in the components which are symmetrical (such as resistors and parasitic bipolar transistor). This symmetry is achieved specifically by adding a p+ diffusion to the source of one of the NMOS transistors. The added p+ diffusion insures that the resistance seen by both SCRs is the same, thus insuring that the current through both SCRs is identical, thereby creating identical turn-on conditions for both SCRs.

DESCRIPTION OF THE PREFERRED EMBODIMENT

We now describe the preferred embodiment of an integrated circuit and a method of fabrication of an electrostatic discharge (ESD) device where the latter is part of high voltage NMOS transistors and where the ESD device, in the form of two parasitic SCRs, is integrated with these NMOS transistors.

Figure 1:
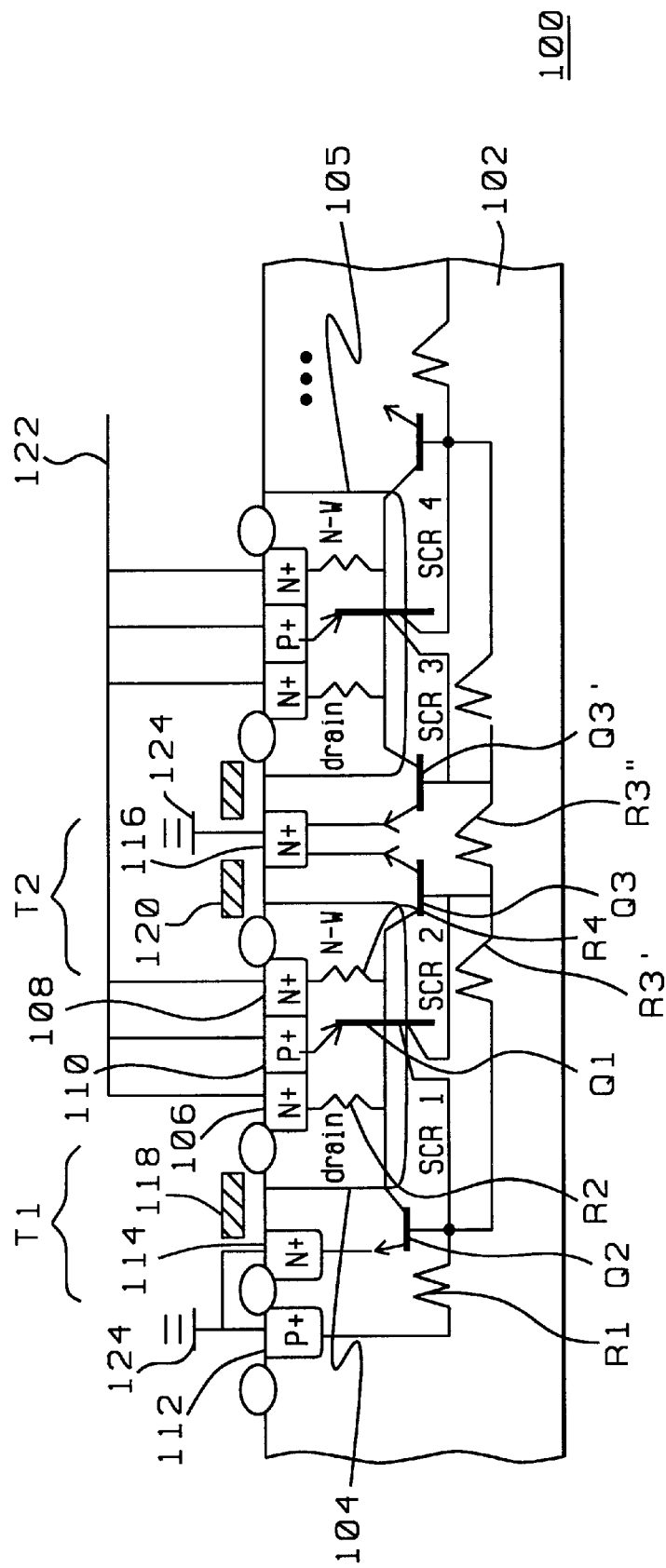
FIG. 1 is a cross-sectional view of NMOS transistors and their associated parasitic SCRs of the prior art.
Figure 2:
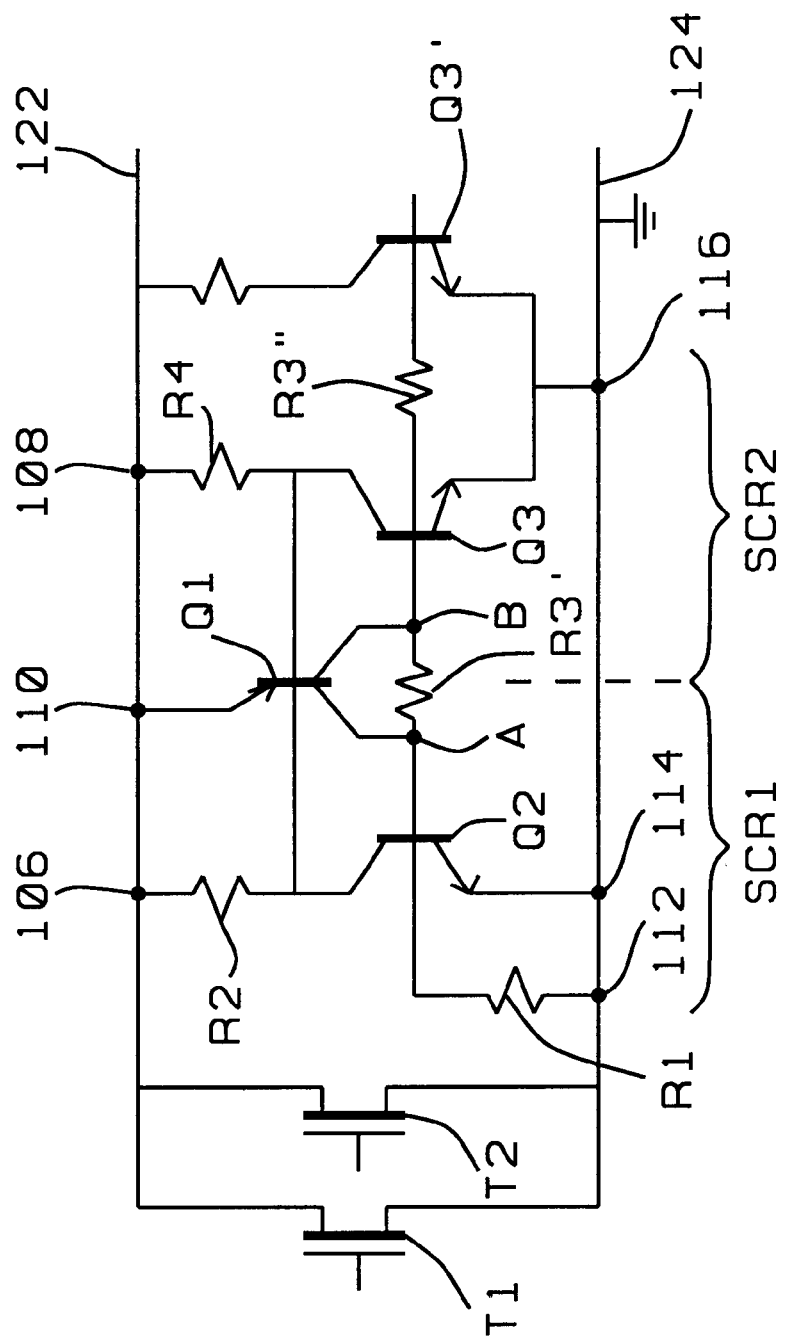
FIG. 2 is an equivalent circuit diagram of FIG. 1.
Figure 3:
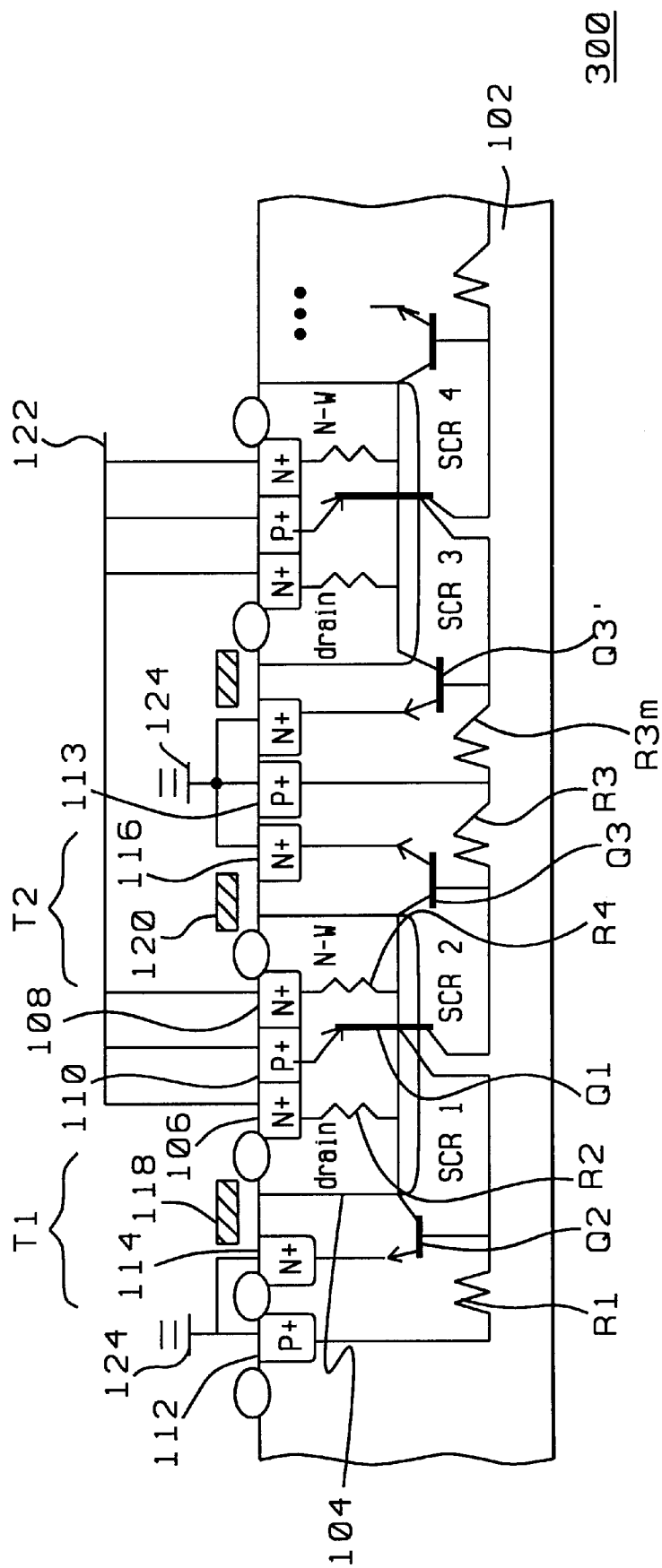
FIG. 3 is a cross-sectional view of NMOS transistors with their associated parasitic SCRs (showing the symmetric layout of parasitic resistors R1 and R3) of the preferred embodiment of the present invention.

Referring now to FIG. 3, we show the preferred embodiment of the present invention. FIG. 3 is a cross-sectional view of two n-channel metal oxide semiconductor (NMOS) transistors with two parasitic silicon controlled rectifiers (SCR), where the SCRs are created by p+ diffusion 110 in NMOS drain 104. Similar to FIG. 1, the number of NMOS transistors is not limited to the two NMOS transistors discussed(T1 and T2). A second set of NMOS transistors can be realized by mirror imaging (around p+ diffusion 113) the layout of transistors T1 and T2. FIG. 3 shows two additional NMOS transistors and associated parasitic SCR ESD protection devices (SCR3, SCR4) which are duplicated by mirroring around the third p+ diffusion 113. It is obvious to those skilled in the art that any number of ESD protection devices can be created similarly to meet the current requirements of the circuit. In the figures (FIG. 1, 2, 3, and 4) like parts are identified by like numerals.

In FIG. 3, the ESD protection and the high voltage NMOS transistors comprise a semiconductor wafer 100 with a p-substrate 102 with n-well 104 formed in the p-substrate. N-well 104 forms the drain of first and second NMOS transistors T1 and T2.

First and second n+ diffusions 106, 108 are implanted in n-well 104. Between diffusions 106 and 108 is implanted a first p+ diffusion 108. Second and third p+ diffusion 112, 113 are implanted in p-substrate 102 at opposite sides of n-well 104. A third n+ diffusion 114 is implanted in the p-substrate between n-well 104 and second p+ diffusion 112, the third n+ diffusion 114 representing the source of first NMOS transistor T1. A fourth n+ diffusion 116 is implanted in the p-substrate between n-well 104 and third p+ diffusion 113, the fourth n+ diffusion 116 representing the source of the second NMOS transistor T2. A first gate 118 formed between n-well 104 and third n+ diffusion 114 represents the gate of first NMOS transistor T1. A second gate 120 formed between n-well 104 and fourth n+ diffusion 116 represents the gate of second NMOS transistor T2. Diffusions 106, 108, and 110 are connected together by conductive means 122. Diffusions 112, 113, 114, and 116 are tied to a reference potential 124 (typically ground). Note that p+ diffusion 110 provides symmetry for the NMOS transistors, and, more importantly, newly added p+ diffusion 113 provides symmetry for SCR1 and SCR2, by connecting R3 from the base of Q3 to reference voltage 124, thus creating a mirror image with R1, and thereby ensuring that the two SCRs conduct the same current.

The structure as described creates a first parasitic silicon controlled rectifier SCR1 and a second parasitic silicon controlled rectifier SCR 2. Still referring to FIG. 3, SCR 1 further comprises:

a first parasitic pnp bipolar transistor Q1, having its emitter, base, and collector formed by first p+ diffusion 110, n-well 104, and p-substrate 102, respectively, a first parasitic npn bipolar transistor Q2, having its emitter, base, and collector formed by third n+ diffusion 114, p-substrate 102, and n-well 104, respectively, a first parasitic resistor R1 between second p+ diffusion 112 and p-substrate 102, where R1 represents the intrinsic resistance of the p-substrate between the base of Q2 and diffusion 112, a second parasitic resistor R2 between first n+ diffusion 106 and n-well 104. R2 represents the intrinsic resistance of the n-well between the base of Q1/collector of Q2 and diffusion 106.

SCR2 further comprises:

first parasitic pnp bipolar transistor Q1, as described above, a second parasitic npn bipolar transistor Q3, having its emitter, base, and collector formed by fourth n+ diffusion 116, p-substrate 102, and n-well 104, respectively;

a third parasitic resistor R3 between third p+ diffusion 113 and p-substrate 102, where R3 represents the intrinsic resistance of the p-substrate between the base of Q3 and diffusion 113, a fourth parasitic resistor R4 between second n+ diffusion 108 and n-well 104. R4 represents the intrinsic resistance of the n-well between the base of Q1/collector of Q3 and diffusion 108.

Figure 4:
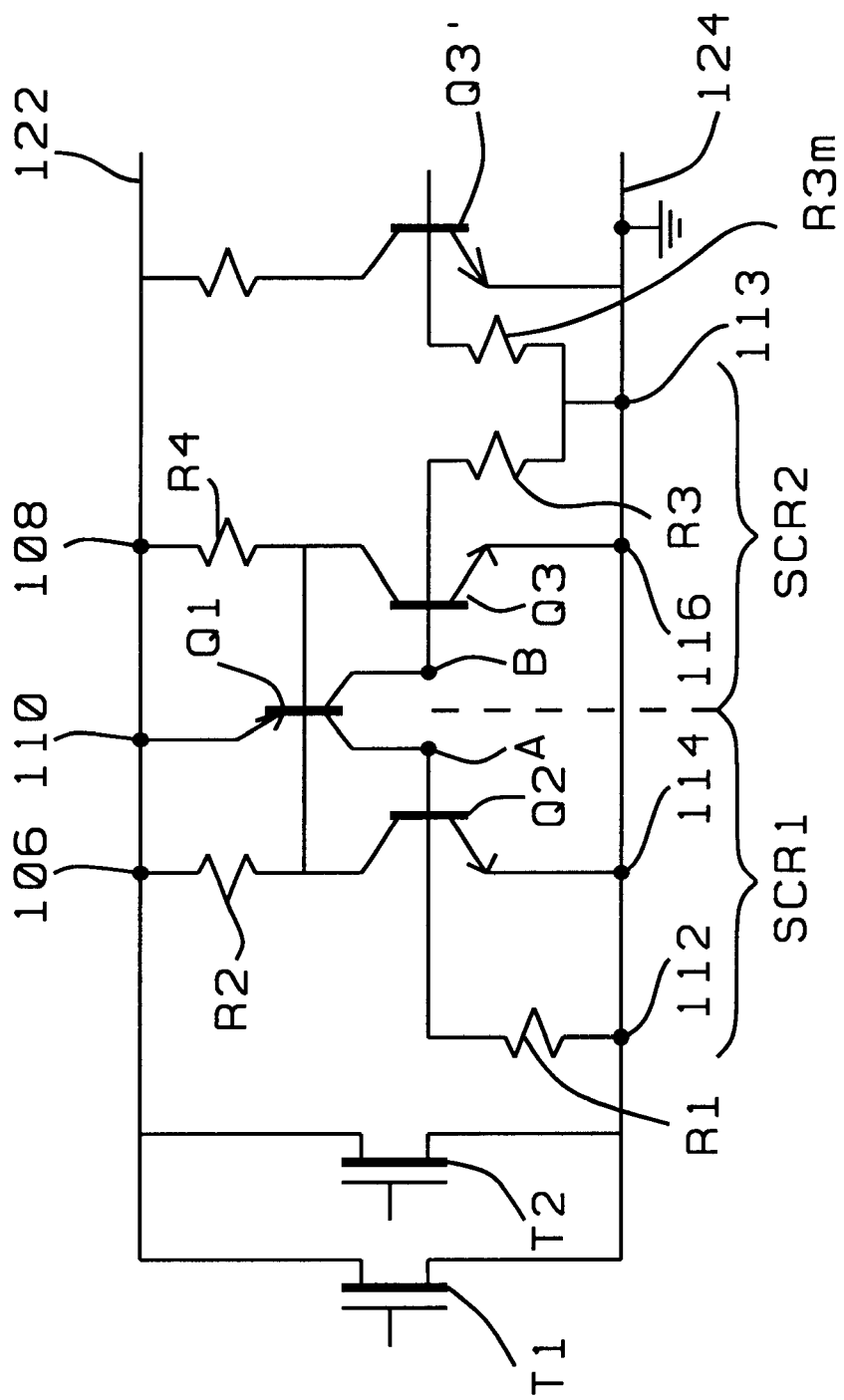
FIG. 4 is an equivalent circuit diagram of FIG. 3.

The benefits of the present invention will be further demonstrated by inspection of FIG. 4, which is the equivalent circuit diagram of FIG. 3. FIG. 4 shows transistors T1 and T2 connected between conductive rail 122 and reference potential 124. SCR1 and SCR2 are connected similarly between rails 122 and 124. FIG. 4 reveals the symmetry of SCR1 and SCR2, where transistor Q1 is shared between the two SCRs. Resistor R3 is now connected between Node B and p+ diffusion 113, whereas in the prior art (see FIG. 2) resistor R3' was connected between Nodes A and B, and resistor R3" was connecting the base of transistor Q3 with the base of its mirror image transistor Q3'. R3', thus contributed to an uneven current distribution. Note that in FIG. 4 the path from the collector of Q1 to Q2 to R1 to rail 124 is identical to the path from the collector of Q1 to Q3 to R3 to rail 124. Therefore, the current from Q1 via Q2, R1, and 124 is the same as the current from Q1 via Q3, R3 to rail 124. In addition to the asymmetry of the prior art just described, there is in FIG. 2 another asymmetry which has been eliminated by the present invention. In FIG. 2 bipolar parasitic transistor Q3 is connected via parasitic resistor R3" to the mirror image transistor Q3'. In contrast, in FIG. 4 resistor R3 is tied to p+ diffusion 113 and therefore uncoupled from the "mirror image resistor R3m" which is created when p+ diffusion 113 is the centerline for the mirror image of another set of NMOS transistors and parasitic SCRs. Diffusions 106, 108, 110, 112, 113, 114, and 116 are indicated for clarification of FIGS. 2 and 4.

Because in the prior art (per FIGS. 1 and 2):

$$R1+R3'>R1$$

SCR2 turns on easier and has to dissipate more current. In the new device (per FIGS. 3 and 4) the turn-on condition for SCR1 and SCR2 is identical because:

$$R1=R3$$

i.e., the same amount of current is dissipated by SCR1 and SCR2.

It follows from the above that the preferred embodiment of the present invention provides these advantages:

a) The current distribution between the first SCR (SCR1) and the second SCR (SCR2) is uniform.

b) The turn-on time for both SCRs is the same.

c) The turn-on conditions for both SCRs are identical.

Experiments conducted with the circuit of the invention are tabulated in Table 1. They indicate an increase of the Human Body Model pass/fail voltage from 6 kV/6.5 kV of the prior art to 8 kV, which is the machine limit. The specification calls for a pass/fail voltage of 2 kV. Table 1 also shows that the Machine Model voltage increased from 350V/400V for the device of the prior art to 800V/850V for the invention (the Machine Model involves higher currents).

TABLE 1

| Summary | Human Body Model pass/fail voltage | Machine Model |
|---|---|---|
| old structure | 6 kV/6.5 kV | 350 V/400 V |
| new structure | 8 kV | 800 V/850 V |

Figure 5:
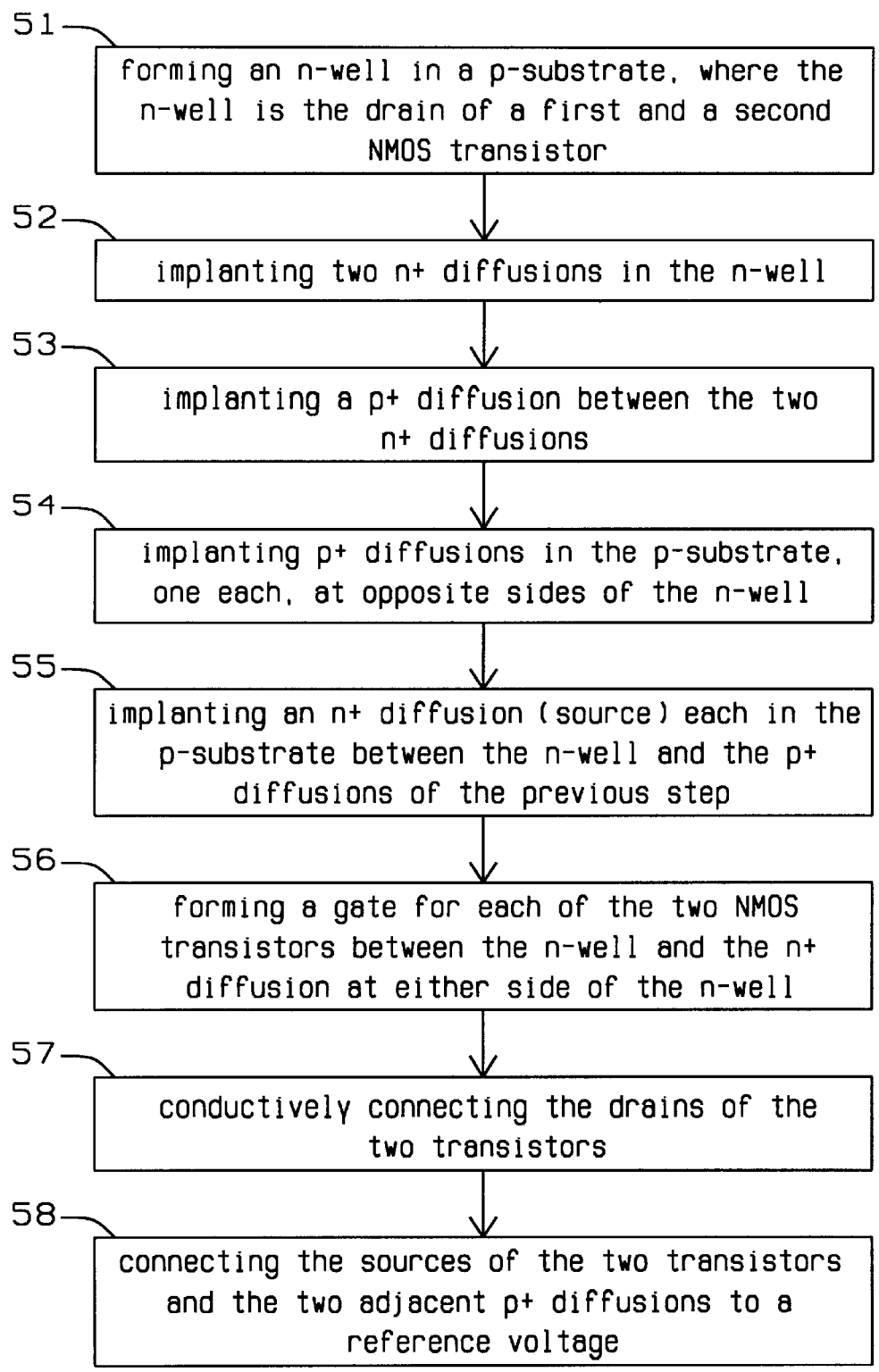
FIG. 5 is a block diagram of the method of the invention.

We now discuss the method of this invention of protecting high voltage n-channel metal oxide (NMOS) semiconductor transistors from electrostatic discharge (ESD) by parasitic silicon controlled rectifiers (SCR), by reference to FIG. 5.

a) BLOCK 51 describes forming an n-well in a p-substrate, where the n-well is the drain of a first and a second NMOS transistor.

b) in BLOCK 52 a first and second n+ diffusions is implanted in the n-well.

c) in BLOCK 53 a first p+ diffusion is implanted between the two n+ diffusions of the previous step.

d) next there follows in BLOCK 54 the implanting of a second and a third p+ diffusion in the p-substrate at opposite sides of the n-well.

e) in BLOCK 55 there is implanted a third and a fourth n+ diffusion (the source for each of the two transistors) in the p-substrate between the n-well and the p+ diffusions of the previous step and adjacent to them.

f) in BLOCK 56 a gate is formed for each of the two NMOS transistors between the n-well and the third and fourth n+ diffusions at either side of the n-well.

g) BLOCK 57 connects through conductive means the drains of the two transistors.

h) BLOCK 58 connects the sources of the two transistors and the two adjacent p+ diffusions to a reference potential.

Note that the components described in the steps above from BLOCK 53 through 58 are arranged symmetrically around the p+ diffusion 110. This symmetrical layout insures that SCR1 and SCR2 are also arranged symmetrically, including the number and size of the parasitic resistances R1–R4 and the parasitic bipolar transistors. This symmetrical layout ensures a uniform current distribution in the two parasitic SCRs which results in turn-on conditions for SCR1 and SCR2 being identical. The uniform current distribution has been confirmed through scanning electron microscopy (SEM) which shows a uniform photo-emission (e-/hole recombination) of the "four fingers" of a layout designed according to the principles of the present invention. In similar SEM photos of devices designed according to the principles of the prior art, only two fingers (the inner ones) show a significant dissipation of current.

The method of the present invention, therefore, protects the first and said second NMOS transistor mentioned in BLOCK 51 from ESD because the current distribution of a first and second intrinsic parasitic SCR is even. The method of the present invention also allows the aforementioned first and said second NMOS transistors to be duplicated by mirroring them around either the second or third p+ diffusion (refer to BLOCK 54).

While the invention has been particularly shown and described with reference to the preferred embodiments thereof, it will be understood by those skilled in the art that various changes in form and details may be made without departing from the spirit and scope of the invention.

What is claimed is:

1. A method of protecting high voltage n-channel metal oxide (NMOS) semiconductor transistors from electrostatic discharge (ESD) by parasitic silicon controlled rectifiers (SCR):

providing a semiconductor wafer with a p-substrate;

forming an n-well in said p-substrate, where said n-well is the drain of a first and a second NMOS transistor;

implanting first and second n+ diffusions in said n-well;

implanting a first p+ diffusion between said first and said second n+ diffusion;

implanting a second and a third p+ diffusion in said p-substrate at opposite sides of said n-well;

implanting a third n+ diffusion in said p-substrate between said n-well and said second p+ diffusion and adjacent to said second p+ diffusion;

implanting a fourth n+ diffusion in said p-substrate between said n-well and said third p+ diffusion and adjacent to said third p+ diffusion;

forming a first gate of said first NMOS transistor between said n-well and said third n+ diffusion;

forming a second gate of said second NMOS transistor between said n-well and said sixth n+ diffusion;

connecting said first, said second n+ diffusion, and said first p+ diffusion by conductive means; and connecting said third, said fourth n+ diffusion and said second and said third p+ diffusion to a reference potential.

2. The method of claim 1, whereby said first and said second NMOS transistor are protected from ESD by a first and a second intrinsic parasitic SCR.

3. The method of claim 1, whereby the current distribution between said first and said second SCR is even.

4. The method of claim 1, whereby the turn-on conditions for said first and second SCR are identical.

5. The method of claim 1, whereby said first and said second NMOS transistors are duplicated by mirroring them around said third p+ diffusion.

* * * * *